United States Patent [19]

Togei et al.

[11] 4,031,608

[45] June 28, 1977

[54] PROCESS FOR PRODUCING SEMICONDUCTOR MEMORY DEVICE UTILIZING SELECTIVE DIFFUSION OF THE POLYCRYSTALLINE SILICON ELECTRODES

[75] Inventors: Ryoiku Togei; Akira Takei; Kunihiko Wada, all of Kawasaki, Japan

[73] Assignee: Fujitsu Ltd., Japan

[22] Filed: Apr. 8, 1976

[21] Appl. No.: 675,196

[30] Foreign Application Priority Data

Apr. 11, 1975 Japan .................................. 50-43388

[52] U.S. Cl. .................................. 29/578; 29/571; 148/174; 148/187; 357/24; 357/41; 357/52; 357/59

[51] Int. Cl.[2] .................. H01L 21/28; H01L 21/22; H01L 29/78

[58] Field of Search ............ 148/174, 187; 29/578, 29/571; 257/24, 59, 41, 52

[56] References Cited

UNITED STATES PATENTS

| 3,720,922 | 3/1973 | Kosonocky | 357/24 X |
| 3,728,590 | 4/1973 | Kim et al. | 357/24 |
| 3,761,744 | 9/1973 | Smith | 357/24 X |
| 3,764,410 | 10/1973 | Hays | 148/187 |
| 3,836,409 | 9/1974 | Amelio et al. | 148/187 |
| 3,852,801 | 12/1974 | Itoh et al. | 357/24 |
| 3,866,067 | 2/1975 | Amelio | 357/24 X |
| 3,911,560 | 10/1975 | Amelio et al. | 29/578 |
| 3,938,174 | 2/1976 | Sano | 357/59 X |
| 3,943,545 | 3/1976 | Kim | 357/24 |

Primary Examiner—L. DeWayne Rutledge
Assistant Examiner—W. G. Saba
Attorney, Agent, or Firm—Staas & Halsey

[57] ABSTRACT

A semiconductor memory device provided with one transferring electrode, one gate electrode and one diode of a charge coupled device is produced by a process with a reduced number of steps of diffusion and patterning. Both electrodes consist of doped polycrystalline silicon and both are electrically connected to a resistive layer which consists of non-doped polycrystalline silicon. A potential barrier between the region of both electrodes is removed due to the resistive layer. The resistive layer is formed by utilization of a two stage deposition of the polycrystalline silicon layer with appropriate masking steps.

20 Claims, 7 Drawing Figures

PROCESS FOR PRODUCING SEMICONDUCTOR MEMORY DEVICE UTILIZING SELECTIVE DIFFUSION OF THE POLYCRYSTALLINE SILICON ELECTRODES

This invention relates to a process for producing a semiconductor memory device, and, more particularly a semiconductor memory device employing a structure of a charge coupled device, hereinafter referred to as a CCD. Recently, attention has been concentrated upon employing CCD as a memory device.

In the general structure of CCD, for example, of a three-phase CCD, one gate electrode and a plurality of three electrodes for transferring electric charges are successively arranged on the top surface of an insulating material, which covers the semiconductor material substrate. When pulse voltages are applied to the electrodes, a distribution of electric potential is defined depending upon the magnitudes of the pulse voltages and the type and thickness of the insulating material layer. The distribution of the electric potential must include a barrier at a space between the two electrodes whereby said barrier inhibits the quick transfer of an electric charge from a region of one electrode to another region of a neighbouring electrode. This fact makes it difficult to reduce the access time of a memory device employing the CCD structure.

This invention is generally directed to a process for producing a semiconductor memory device, which comprises:

a semiconductor material substrate having one particular conductivity type and comprising on the surface thereof a doped layer with an impurity of the opposite conductivity type, one surface region of said substrate adjoining said doped layer being used as a gate region, and another surface region of said substrate adjoining said one surface region being used as a memory cell region;

an insulating layer placed on said substrate over said gate region and said memory cell region;

a gate electrode consisting of doped polycrystalline silicon, said gate electrode being placed on a part of said insulating layer over said gate region;

a memory cell electrode consisting of doped polycrystalline silicon, said memory cell electrode being placed on another part of said insulating layer over said memory cell region, and;

a resistive layer consisting of a non-doped polycrystalline silicon layer, placed on still another part of said insulating layer, located between said both electrodes and connected to said both electrodes.

In the memory device an electric charge of said opposite conductivity type is either injected from said doped layer through said gate region into said memory cell region or transferred from said memory cell region through said gate region to said doped region, depending upon the electric potential level in said substrate, which level is established by an electric field created by each of said electrodes through said insulating layer.

It is an object of this invention to provide a process for producing the semiconductor memory device, in which a barrier of the electric potential does not exist.

It is another object of the invention to provide a process, in which any layer is used as a mask for a part of the previously formed, underlying layer and the remaining unmasked part of this underlying layer is etched by an etchant which does not dissolve the masking layer, thereby decreasing the number of the photolithographic processes required.

It is still another object of the invention to provide a process, in which the number of diffusion steps is decreased.

A basic concept of the invention resides in the fact that a non-doped polycrystalline silicon layer is formed on the semiconductor material substrate in a continuous layer, and, further, an insulating layer, usually of $SiO_2$, is formed on a part of the polycrystalline silicon layer over a space between the gate electrode and the memory cell electrode. The insulating layer serves as a mask for a doping, which renders the unmasked parts conductive.

According to the process of the invention, a first insulating layer, usually although not necessarily an oxide layer of $SiO_2$, is first formed on a portion of the monocrystalline semiconductor material substrate, which portion is surrounded by a channel stop and electrically separated from the other portions by said channel stop. The first insulating layer is in fact formed on the entire top surface of the substrate. Since a part of the first insulating layer will be left in the sixth step of the process of the invention so that said one part masks the memory cell region and the gate region of the substrate, the first insulating layer must be formed at least over these regions.

The thickness of the first insulating layer depends on the capacity of the memory cell and gate region and can be from 300 to 2000 angstroms with regard to $SiO_2$.

Second, a first, non-doped polycrystalline silicon layer is placed on the first insluating layer, so that said first polycrystalline silicon layer is placed in the same location as that of the memory cell electrode. The polycrystalline silicon is first placed over the entire surface of the substrate in a manner such that the polycrystalline silicon is typically deposited by the decomposition of silane at an elevated temperature of approximately 600° C. The polycrystalline silicon is then selectively removed in the fourth step of the process according to the invention.

Third, the second insulating layer, usually although not necessarily an oxide layer of $SiO_2$, is formed on the first polycrystalline silicon electrode by thermal oxidation.

Fourth, a part of both the second insulating layer and the first polycrystalline silicon layer is removed to expose a part of the first insulating layer over a region of the substrate, in which the gate and the diode will be located. The remaining layers are therefore selectively placed in the location of the memory cell electrode and the resistance layer.

Fifth, a second, non-doped polycrystalline silicon layer is formed over a part of each of the first and second insulating layers in a manner such that the second, non-doped silicon layer masks both said parts above the resistance layer and the gate region.

Sixth, the unmasked parts of the first and second insulating layers, are removed by an etchant which dissolves these insulating layers but does not effectively dissolve the polycrystalline silicon layer, thereby exposing a part of the first, non-doped polycrystalline silicon layer and the substrate.

Finally, an impurity of the opposite conductivity type is introduced into the exposed parts of the first, non-doped polycrystalline silicon layer and substrate, as well as the second, non-doped polycrystalline silicon layer. In the step of introducing the impurity, the nonetched part of the second insulating layer, which part had, in the fifth step, been masked by the overlying of the second polycrystalline silicon layer for protection against the etchant, now masks the underlying part of the first, non-doped polycrystalline silicon layer for protection against the impurity. Accordingly, the exposed polycrystalline silicon becomes conductive enough for serving as an electrode, and the doped layer is formed in the substrate. The masked part of the first, non-doped silicon layer is protected from doping and thus serves as a resistive layer.

The invention is further illustrated in detail by way of several embodiments thereof in connection with the drawings, in which.

The starting point of the process is at the substrate of the monocrystalline semiconductor material 1, which is preferably silicon. However, it should be noted that any semiconductor material adapted for conducting electrical charges can be used with the invention. It should also be noted that the drawings are schematically drawn to illustrate the principles of the invention.

Hereinafter, the semiconductor material and all the other formed layers on it will be collectively referred to as a wafer.

Figure 1:
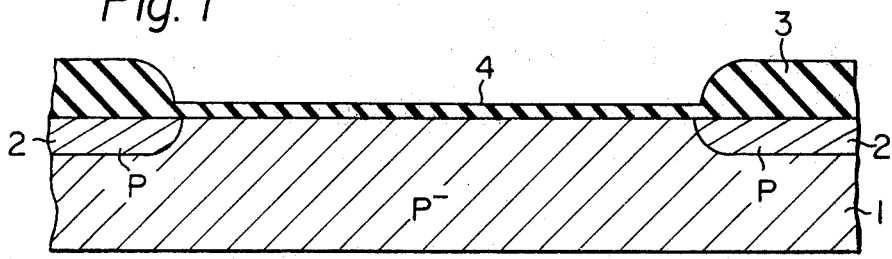
FIGS. 1 through 5 illustrate the process of the present invention, by which the elements of the memory device are produced.

In FIG. 1, the substrate 1 possesses a conductivity of a P-type and a concentration of impurities usually about $10^{15}$ atoms per cubic $cm^3$. This concentration of the impurity is relatively lower than the concentrations of the impurity in the hereinafter illustrated channel stop layers, and hence, the substrate is designated in the drawings as a $P^-$-type. It is obvious that all elements of the wafer can be of conductivity types opposite from the conductivity types described in the specification.

An impurity such as boron is introduced into a part of the substrate 1 to form a P-type layer 2 (FIG. 1) having a concentration usually of $5 \times 10^{16}$ atoms of boron per cubic centimeter. The P-type layer extends in a closed path around the other part of the substrate 1, in which the memory device will be formed, and thus serves as a channel stop.

The wafer contains channel stop layers, which separate the memory devices from each other. A process for producing the memory device in a region surrounded by the channel stop layer is described hereinafter. During the formation of the P-type channel stop layer 2, a thick oxide layer 3 of $SiO_2$, usually about 1 micron thick is formed on the channel stop 2. A top surface of the wafer surrounded by the channel stop layer 2 is protected by an oxide layer from the diffusion of the channel stop and the first insulating layer 4, usually consisting of $SiO_2$, is formed on the substrate after removing the oxide layer. The $SiO_2$ layer 4 is thermally grown on the top surface of substrate 1, usually grown to a thickness of from 1000 to 1500 angstroms.

Figure 2:
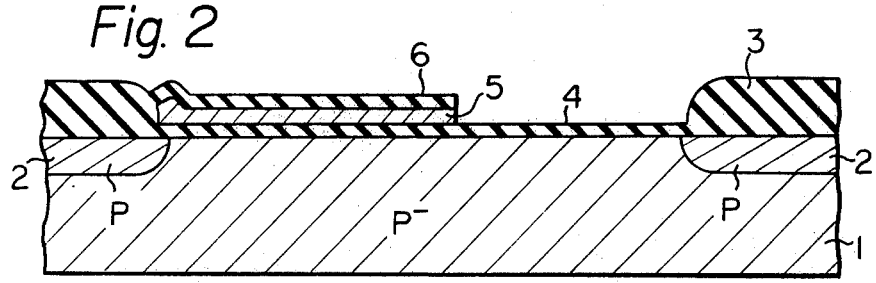

In FIG. 2, a non-doped polycrystalline silicon layer 5 and a $SiO_2$ layer 6 are selectively placed over a region of the substrate, in which the memory cell is defined by an electric potential distribution. The polycrystalline silicon 5 usually forms a thickness of, for example, 0.5 microns, caused by the decomposition of silane. The polycrystalline silicon layer 5 will serve as an electrode to control the electric potential distribution of the underlying substrate, after doping the silicon with an impurity rendering the polycrystalline silicon conductive. In order to create a structure as seen in FIG. 2, the non-doped polycrystalline silicon 5 is deposited on the entire surface of the $SiO_2$ layer 4 either by evaporation or by CVD. Subsequently, the $SiO_2$ layer 6 is formed by oxidizing the entire surface of the silicon layer 5 at an elevated temperature, usually at 1000 to 1100° C. The $SiO_2$ layer 6 is selectively removed to leave only the required part and to expose one part of the non-doped polycrystalline silicon layer 5. The exposed part of the silicon layer is now removed by an etchant, usually a solution of HF and $HNO_3$, while the remaining $SiO_2$ layer masks the underlying polycrystalline layer against the etchant.

Figure 3:
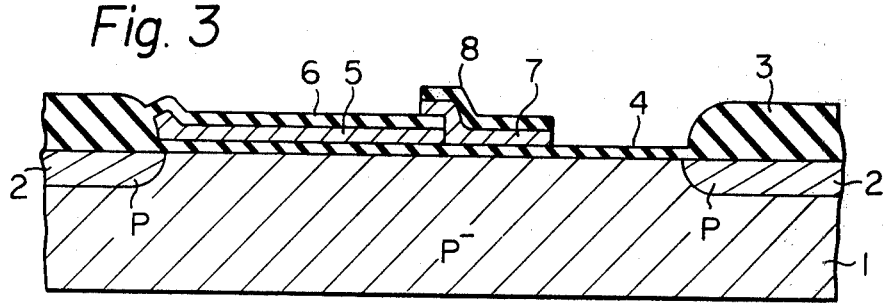

In FIG. 3, a non-doped polycrystalline silicon layer 7 is deposited on the entire top surface of the wafer, usually to a thickness of from 0.2 to 0.5 microns. The now deposited, non-doped polycrystalline silicon 7 is also deposited on the borders of the previously deposited polycrystalline silicon 5 and the $SiO_2$ layer 6. Accordingly, a continuous non-doped polycrystalline silicon layer, which consists of layers 5 and 7, is formed on the $SiO_2$ layer 4.

A $SiO_2$ layer 8 is formed at an elevated temperature of 1000 to 1100° C over the entire surface of the silicon layer 7 by oxidation. The $SiO_2$ layer 8 is usually from 500 to 2300 angstroms thick. A structure shown in FIG. 3, in which the non-doped polycrystalline silicon layer 7 and the $SiO_2$ layer 8 mask both the underlying layer 4 above the gate region and a part of the non-doped polycrystalline silicon 5, is created by first selectively removing the $SiO_2$ layer 8 and then removing the exposed, non-doped polycrystalline silicon 7, while the overlying $SiO_2$ layer 8 is being used as a mask against an etchant of silicon. The remaining polycrystalline silicon 7 will serve as a gate electrode after doping the silicon with an impurity.

Figure 4:
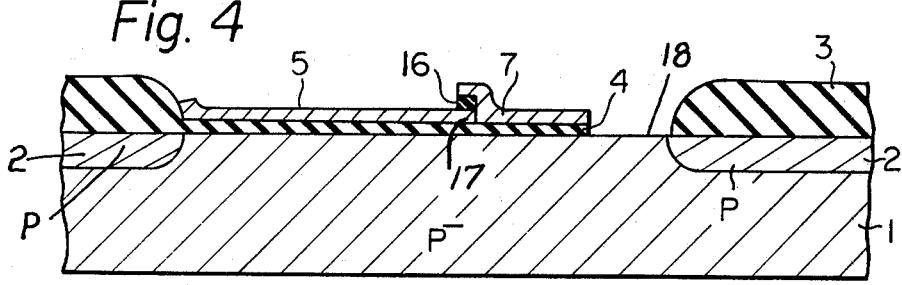

The wafer having a structure as seen in FIG. 3 is dipped in an etching solution capable of dissolving the $SiO_2$ but not the polycrystalline silicon, usually a solution of HF. The removal of $SiO_2$ simultaneously takes place with regard to the $SiO_2$ layer 8, the exposed part of the $SiO_2$ layer 6 and the exposed part of the $SiO_2$ layer 4. A part 16 (FIG. 4) of the $SiO_2$ layer 6 (FIG. 3), which underlies below the polycrystalline silicon layer 7, is protected from the etching by virtue of the masking effect of the non-doped polycrystalline silicon 7. A structure as shown in FIG. 4 is, therefore, obtained. It is to be noted that a part 16 (FIG. 4) of $SiO_2$ layer 6 is left under the non-doped polycrystalline layer 7. The remaining part 16 of $SiO_2$ layer 6 masks a part 17 of the underlying non-doped polycrystalline silicon layer 5 beneath the $SiO_2$ layer 6. This masked part 17 of the non-doped polycrystalline silicon layer 5 will serve as a resistive layer which connects the memory cell electrode 5 to the gate electrode 7. This resistive layer 17 is usually from 1 to 3 microns in length, and has a width corresponding to the usual width of the electrodes of the memory device. All of the polycrystalline layers 5 and 7 are exposed except for the masked part 17 of layer 5, in addition to a part of the substrate 1.

Figure 5:
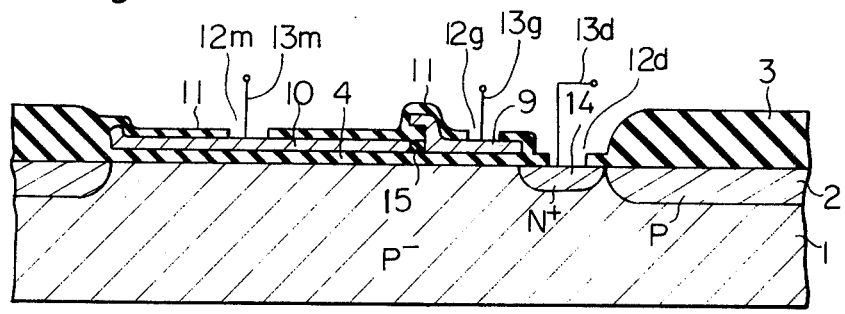

An impurity having the opposite conductivity type from the conductivity type of the substrate is introduced into the exposed parts either by diffusion or by ion-implantation. The exposed part 18 of the substrate 1 is heavily doped usually to a concentration of about $10^{20}$ atoms per cubic centimeter and thus is designated as the N+-type doped layer 14 (FIG. 5). The exposed part of polycrystalline silicon 7 (FIG. 4) and the exposed part of the polycrystalline silicon 5 are rendered with a suitable conductivity serve as electrodes of memory cell 10 and gate 9, respectively (FIG. 5).

The masked part 15 (FIG. 5) of the non-doped polycrystalline silicon 5 (FIG. 4) is protected from introduction of remaining part 16 of the impurity by SiO$_2$ layer 6. In order to assure the protection effect of the remaining part 16 of SiO$_2$ layer 6, this layer should be at least 800 angstroms thick with regard to the diffusion, and several thousands of angstrom thick with regard to the ion-implantation.

An oxide layer 11 (FIG. 5) of SiO$_2$ is formed on the top surface of the wafer during the introduction of the impurity.

Windows 12 $m$ (memory cell) and 12 $g$ (gate) are formed in the SiO$_2$ layer 11 to expose portions of the doped polycrystalline silicon memory cell 10 and gate 9, and a window 12 $d$ (diode) is formed in the SiO$_2$ layer 11 to expose the N+-type diffused layer 14. The electrical leads 13 $g$, $d$, $m$ are brought into electrical contact with the three exposed members, usually by evaporating aluminum followed by selective etching. The non-doped part 15 of the polycrystalline silicon 5 (FIG. 4) is located between and connected to the gate electrode 9 and the memory cell electrode 10, and hence can be considered as a resistive layer connected between both electrodes.

In another embodiment of the invention, MOS transistors associated with the circuitry of the memory device are formed on the same body with the memory device and are simultaneously formed with the steps of producing a memory device.

Although not described in order to avoid unnecessarily complicating this description, it is obvious that the selective placing and etching in the process of the invention are performed by a well-known photolithographic technique.

The memory device employing for example, a P-type semiconductor substrate of a structure as shown in FIG. 5 is operated as follows. The memory cell and doped layer are maintained at different, positive electric potentials in a normal state. The memory is performed on the presumption that information "1" is storing electrons in the memory cell.

Write

Figure 6:
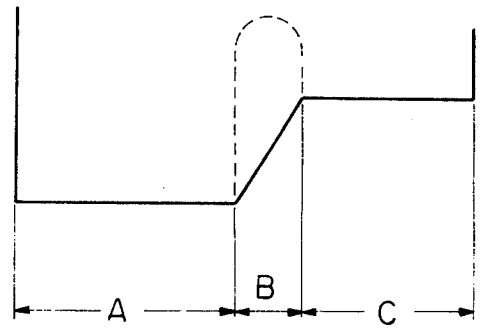
FIGS. 6 and 7 illustrate an electric potential distribution within the substrate.

As shown in FIG. 6, at the instant of writing information "1" a pulse voltage of zero value is applied to the doped layer 14 (FIG. 5) and gate electrode 9 is maintained at positive electric potential. The voltage applied to the gate is lower than that of the memory cell. As a result of the applied voltages, the electric potential distribution is formed in the memory cell region A, the non-doped polycrystalline silicon B, and the gate region C of the substrate, as shown by the solid line of FIG. 6. Due to the presence of non-doped polycrystalline silicon between the regions A and C, the linear potential distribution is formed in the region B. The gradient of this distribution in the region B depends upon the resistance value of the non-doped polycrystalline silicon. The electric charge is transferred from the region C to the region A through the region of B. In accordance with the conventional device, the distribution of potential in the region B is as shown by the dotted line in FIG. 6. Accordingly, the peak of the electric potential at the region B acts as a barrier, which lowers the transferring speed of the electric charge. From the comparison of both the solid and dotted lines of FIG. 6, it is clear that the transferring speed of the electrical charge in the memory device produced by a process of the present invention is higher than that produced by the conventional process.

An information "0", is defined as the non-existence of an electric charge in the memory cell. The information "0" can be written by applying a positive pulse voltage to the gate 9, while positive voltages of the memory cell and the doped layer are maintained.

Read

The electric potential of the memory cell drops to zero and is maintained at this state, while the positive pulse voltage is applied to the gate electrode.

Figure 7:
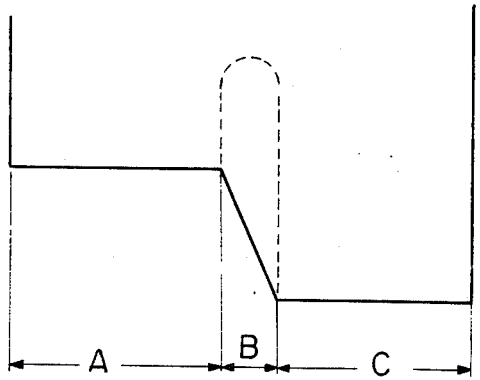

In FIG. 7, as a result of the applied voltages, the electric potential distribution is formed in the memory cell region A, the non-doped polycrystalline silicon B, and the gate region C of the substrate, as shown by the solid line in FIG. 7. Due to the presence of non-doped polycrystalline silicon between the regions A and C, the linear potential distribution is formed in the region B. The electric charge is transferred from the region A to the region B and is injected into the region C.

Contrary to the device produced by the process of invention, the conventional device possesses a peak of electric potential as shown by the dotted line in FIG. 7. From the comparison of the solid and dotted lines of FIG. 7, it can be seen that the transfer speed of electric charge is higher in the device produced by the method of the present invention than by the conventional process.

The electric potential of the N+-type doped layer 14 (FIG. 5) is lowered by an injection of the electric charge from the memory cell region to the doped layer. The voltage is lowered according to the quantity of the injected charge. The lowered electric potential is detected by a sensing amplifier (not shown) connected to the lead 13 $d$ (FIG. 5), thereby reading the information which has been stored in the memory cell. Immediately after the detection of voltage being lowered, usually after several tens of nanosecond, an electric potential of the N+-type doped layer 14 (FIG. 5) is set at zero value, and, subsequently, usually after several hundreds of nanosecond, the electric potential of the memory cell is restored to the positive value, so that an electric charge is again injected into the memory cell region.

In a case where the information "0" is stored in the memory cell, the positive electric potential of the doped layer 14 (FIG. 5) is unchangeably maintained, because no electric charge is injected into the doped layer 14. Since the memory cell remains positive in a normal state, the electric potential of the memory cell is restored, as stated above, to a positive value after the READ period. In this case, no electric charge is injected into the memory cell, because the potential of the N+-type doped layer is unchangeably maintained.

Accordingly, it is possible to read the information of the memory cell without destroying the effectiveness of the memory cell.

Refresh

Since the memory cell has a positive electric potential during the storage of the information, minority carriers are generated in the memory cell with the result being that the "0" state is changed to the "1" state. Accordingly, the memory cell must be periodically, usually every several tens of milliseconds, refreshed by means of dropping the potential of the memory cell electrode to zero.

The refreshing is performed in the same manner as that in the reading of the information. Namely, the electric potential of the memory cell drops to zero, while the positive pulse voltage is applied to the gate electrode thereby keeping the minority carriers, which cause dark current, away from the memory cell region. The electric charge stored in the memory cell region is injected into the doped layer 14 (FIG. 5). The injected charge is returned to the memory cell by the same methods as in the reading. Immediately after the detection of a change in voltage, an electric potential of the $N^+$-type doped layer 14 (FIG. 5) is set at zero value, and, subsequently the electric potential of the memory cell is restored to a positive value, so that the electric charge is again injected into the memory cell region. In a case where no change in voltage is detected, i.e., the information is "0", the electric potential of the memory cell is restored to a positive value after the same period as that of information "1". The positive electric potential of the doped layer 14 (FIG. 5) is unchangeably maintained because no electric charge has been injected into the doped layer 14.

Accordingly, the minority carriers are definitely excluded from the memory cell region, while the previously stored electric charge is returned into the memory cell, and, furthermore, the electric charge previously not stored, is not injected into the memory cell.

What we claim is:

1. A process for producing a semiconductor memory device, which device comprises:
   a semiconductor material substrate having one particular conductivity type and comprising, on the surface thereof, a doped layer with an impurity of conductivity type opposite to said one particular conductivity type, one surface region of the substrate adjoining said doped layer being used as a gate region, and another surface region of said substrate adjoining said one surface region being used as a memory cell region;
   a first insulating layer situated on said substrate over said gate region and said memory cell region;
   a gate electrode consisting of a doped polycrystalline silicon, said gate electrode being situated on a part of said insulating layer over said gate region;
   a memory cell electrode consisting of doped polycrystalline silicon, said memory cell electrode being situated on another part of said insulating layer over said memory cell region;
   a resistive layer consisting of non-doped polycrystalline silicon layer, disposed on still another part of said insulating layer, located between and connected to said both electrodes;
   wherein an electric charge of said opposite conductivity type is either injected from said doped layer though said gate region into said memory cell region or transferred from said memory cell region through said gate region to said doped layer, depending upon the electric potential level in said substrate, which level is established by an electric field created by each of said electrodes through said insulating layer;
said process comprising the steps of:
   forming the first insulating layer on said substrate over at least said memory cell region and said gate region;
   forming a first non-doped polycrystalline silicon layer on said first insulating layer;
   forming a second insulating layer on said first polycrystalline silicon layer;
   removing a part of said second insulating layer and said first polycrystalline silicon layer, thereby selectively placing these layers so as to be used for a masking portion and said memory cell electrode, respectively;
   forming a second non-doped polycrystalline silicon layer so as to mask said first insulating layer over said gate region and to mask said masking portion of said second insulating layer;
   removing the unmasked parts of both of said first and second insulating layers, by an etchant which dissolves these layers, thereby exposing a part of said first and second polycrystalline silicon layers as well as a part of the substrate;
   introducing an impurity of said opposite conductivity type into said exposed parts so as to dope the exposed polycrystalline silicon with the impurity and to form on the exposed part of the substrate said opposite conductivity type doped layer, wherein the masking portion of the second insulating layer protects the underlying part of the first non-doped polycrystalline silicon layer from the introduction of impurity so as to form a resistance layer therein 2. A process according to claim 1, wherein said first and second insulating layers are $SiO_2$.

3. A process according to claim 2, wherein the impurity of said opposite conductivity type from that of the substrate is introduced by diffusion.

4. A process according to claim 2, wherein the impurity of said opposite conductivity type from that of the substrate is introduced by ion-implantation.

5. A process according to claim 2, wherein said step of forming a second, non-doped polycrystalline layer comprises the steps of:
   forming said second, non-doped polycrystalline silicon layer over the entire top surface of said first and second insulating layers;
   forming a $SiO_2$ layer on the entire surface of said second non-doped polycrystalline silicon layer;
   selectively removing the $SiO_2$ layer so as to mask the underlying polycrystalline silicon layer overlying said gate region and said masking portion; and
   removing the unmasked part of the polycrystalline silicon layer by an etchant capable of dissolving the polycrystalline silicon but not $SiO_2$.

6. A process according to claim 5, wherein said $SiO_2$ layer on the second non-doped polycrystalline layer is simultaneously removed with the removal of the unmasked parts of said first and second insulating layers.

7. A method of producing a semiconductor memory device, comprising the steps of:
   a. providing a semiconductor substrate of a first conductivity type and having a memory cell region, a gate region and a diode region arranged consecutively therein;
   b. forming a first insulating layer on said substrate and covering at least said memory cell and gate regions;
   c. forming a first non-doped polycrystalline silicon layer on said first insulating layer covering said memory cell region and a small portion of said gate region;

d. forming a second insulating layer on said first silicon layer covering said memory cell region and said small portion of said gate region;

e. forming a second non-doped polycrystalline silicon layer over those parts of said first and second insulating layers covering said gate region so as to provide a mask over those portions of said first and second insulating layers overlying said gate region;

f. removing the unmasked portions of said first and second insulating layers so as to expose that portion of said first silicon layer overlying said memory cell region, and that part of said substrate in the area of said diode region; and g. introducing an impurity of a second conductivity type opposite to said first conductivity type into said exposed portion of said first silicon layer, into said second silicon layer, and into said diode region, whereby to form a memory cell electrode from that part of said first silicon layer overlying said memory cell region, to form a gate electrode from that part of said second silicon layer overlying said gate region, and to form a resistance layer from that portion of said first layer covering said small portion.

8. The method of claim 7 wherein said first and second insulating layers formed in steps (b) and (d) are $SiO_2$.

9. The method of claim 8 wherein said first insulating layer provided in step (b) is grown by thermal oxidation.

10. The method of claim 8 wherein said first insulating layer provided in step (b) is from 300 to 2,000 angstroms.

11. The method of claim 7 wherein steps (c) and (d) comprise the steps of;
 forming said first silicon layer so as to cover the entirety of said first insulating layer,
 forming said second insulating layer so as to cover the entirety of said first silicon layer, and
 selectively removing all of said first silicon layer and said second insulation layer except those portions covering said memory cell region and a small portion of said gate region.

12. The method of claim 11 wherein said first silicon layer is removed by application of an etchant thereto.

13. The method of claim 7 wherein step (d) comprises oxidizing said first layer of silicon formed in step (c) at an elevated temperature so as to form $SiO_2$ as said second insulating layer.

14. The method of claim 7 wherein step (e) comprises:
 forming said second silicon layer so as to overlie the entirety of the surface of said substrate so as to form, with said first silicon layer, a continuous silicon structure;
 heating said second silicon layer to an elevated temperature so as to form a third insulating layer of $SiO_2$ overlying said second silicon layer;
 selectively removing those portions of said third insulating layer overlying said memory region and said diode region so as to expose portions of said second silicon layer therebeneath; and
 applying an etchant to said exposed portions of said second silicon layer so as to remove the latter, that portion of said second silicon layer beneath said third insulating layer being shielded from said etchant; and
 wherein step (f) includes removing said third insulating layer so as to expose that portion of said second silicon layer therebeneath.

15. The method of claim 14 wherein step (f) includes application of a etching solution capable of dissolving said insulating layers.

16. The method of claim 7 wherein step (f) includes application of etching solution capable of dissolving said insulating layers.

17. The method of claim 7 wherein step (g) comprises diffusion of said impurity into said substrate.

18. The method of claim 7 wherein step (g) comprises ion-implantation of said substrate.

19. The method of claim 7 wherein, during step (g) an additional insulating layer is formed on top of said first and second silicon layer, and said diode region.

20. The method of claim 19 including the additional step (h) of forming a window in said additional insulating layer over each of said memory cell region, gate region, and diode region for the attachment of electrical terminals to said first silicon layer, second silicon layer, and diode region, respectively.

* * * * *

UNITED STATES PATENT AND TRADEMARK OFFICE
CERTIFICATE OF CORRECTION

PATENT NO. : 4,031,608
DATED : June 28, 1977
INVENTOR(S) : Ryoiku Togei et al

It is certified that error appears in the above-identified patent and that said Letters Patent are hereby corrected as shown below:

On the face of the patent, at "[75] Inventors:", add
--Yoshihiko Hika--.
Column 5, line 4, before "serve" add --to--.

Signed and Sealed this

Twentieth Day of September 1977

[SEAL]

Attest:

RUTH C. MASON
Attesting Officer

LUTRELLE F. PARKER
Acting Commissioner of Patents and Trademarks